(12) United States Patent
Lim et al.

(10) Patent No.: US 7,860,478 B2
(45) Date of Patent: Dec. 28, 2010

(54) POLY-PHASE FILTER

(75) Inventors: Kyoo Hyun Lim, Gyeonggi-do (KR); Sun Ki Min, Gyeonggi-do (KR)

(73) Assignee: FCI, Inc., Seongnam-si, Gyeonggi-do (KR)

( * ) Notice: Subject to any disclaimer, the term of this patent is extended or adjusted under 35 U.S.C. 154(b) by 598 days.

(21) Appl. No.: 11/873,535

(22) Filed: Oct. 17, 2007

(65) Prior Publication Data

US 2008/0094133 A1    Apr. 24, 2008

(30) Foreign Application Priority Data

Oct. 18, 2006    (KR) ...................... 10-2006-0101112

(51) Int. Cl.
  *H04B 1/10*    (2006.01)
(52) U.S. Cl. ....................... 455/307; 455/285; 455/140; 455/197.2; 455/302; 455/306; 329/339
(58) Field of Classification Search ................. 455/307, 455/285, 140, 197.2, 302, 306; 329/339
See application file for complete search history.

(56) References Cited

U.S. PATENT DOCUMENTS

| 7,084,678 | B2 | 8/2006 | van Zeijl | |
|---|---|---|---|---|
| 7,405,613 | B2 * | 7/2008 | De Ruijter | 329/339 |
| 7,426,377 | B2 * | 9/2008 | Tanaka et al. | 455/255 |
| 2002/0168952 | A1 * | 11/2002 | Vishakhadatta et al. | 455/130 |
| 2006/0178125 | A1 * | 8/2006 | Chae et al. | 455/323 |
| 2008/0132191 | A1 * | 6/2008 | Quinlan et al. | 455/302 |

* cited by examiner

*Primary Examiner*—Sanh D Phu
(74) *Attorney, Agent, or Firm*—Jae Y. Park; Kile Part Goekjian Reed & McManus

(57) ABSTRACT

Provided is a poly-phase filter capable of removing an image frequency of a terrestrial digital multimedia broadcasting (T-DMB) receiver in a low intermediate frequency (IF) structure applied to a mobile communication terminal and a receiver having the poly-phase filter. The poly-phase filter includes: a calibration control block for generating first and second filter characteristic control signals which determine electrical characteristics of the filter in response to a control signal including instructions for changing the characteristics of the poly-phase filter and holding the changed values; and a poly-phase filter block for performing filtering on a plurality of input signals having different phases from each other in response to the first and second filter characteristic control signals. Accordingly, the poly-phase filter has advantages of having constant electrical characteristics regardless of changes in a manufacturing process and temperature and a high-performance image rejection function.

3 Claims, 2 Drawing Sheets

POLY-PHASE FILTER

BACKGROUND OF THE INVENTION

1. Field of the Invention

The present invention relates to a poly-phase filter of a terrestrial digital multimedia broadcasting (T-DMB) receiver in a low intermediate frequency (IF) structure applied to a mobile communication terminal such as a cell phone, and more particularly, to a poly-phase filter capable of maintaining a desired value of electrical characteristics of the poly-phase filter regardless of changes in a manufacturing process or temperature.

2. Description of the Related Art

A conventional poly-phase filter applied to a receiver in a low intermediate frequency (IF) structure is described with reference to FIG. 1.

FIG. 1 is a circuit diagram of a conventional low IF receiver.

Referring to FIG. 1, the conventional low IF receiver 100 includes an antenna 110, an amplifier 120, a voltage-controlled oscillator 170, a divider 160, a mixing unit 130, an image rejection channel filter 140, and an IF amplifier 150.

The antenna 110 receives a radio frequency (RF) signal.

The amplifier 120 minimizes noise in the RF signal received by the antenna 110 and amplifies the RF signal. Here, in some cases, the RF signal is amplified by controlling a value of an amplification gain.

The voltage-controlled oscillator 170 generates an oscillating frequency signal having a predetermined frequency.

The divider 160 divides the oscillating frequency signal to generate a plurality of local oscillating frequency signals which are to be used for frequency synthesizing with the amplified RF signal.

The mixing unit 130 includes a first mixer 131 and a second mixer 132. The first mixer 131 mixes an output signal of the amplifier 120 with a first local oscillating frequency signal including two signals which are generated by the divider 160 and have a phase difference of 180°. The second mixer 132 mixes the output signal of the amplifier 120 with a second local oscillating frequency signal including two signals which are generated by the divider 160 and delayed by 90° than those in the first local oscillating frequency signal.

The image rejection channel filter 140 rejects image components in an IF signal output from the mixing unit 130. The IF signal from which the image components are rejected is output through the IF amplifier 150.

A function of the low IF receiver is to convert the RF signal into the IF signal. Here, the IF signal includes the image components in addition to desired real components, so that the low IF receiver has to have a function of rejecting the image components in order to perform accurate signal processing in following operations. In order to perform the function of rejecting the image components, the mixing unit 130 uses two mixers 131 and 132 and controls phases of two paths including an I-path through which an output signal of the first mixer 131 is transmitted and a Q-path through which an output signal of the second mixer 132 is transmitted. Here, the desired real components pass, and a phase of the image components in the I-path is opposite to that in the Q-path so that the phases are vanished. The function of rejecting the image components is performed by the image rejection channel filter 140.

However, a poly-phase processing filter circuit generally includes a resistor and a capacitor. When the poly-phase processing circuit is implemented as an integrated circuit (IC), the resistor and the capacitor can be easily implemented. However, a resistance of the resistor and a capacitance of the capacitor have process variations of 30% and 10%, respectively. When the resistance of the resistor and the capacitance of the capacitor are changed, frequency characteristic of the filter are also changed. In addition to the process variations, when temperature of the IC or temperature of a system including the IC is changed, the resistance of the resistor and the capacitance of the capacitor are also changed. As described above, in order to counter with causes of the changes in the frequency characteristics of the filter such as the changes in circumstances and the process variations, a scheme of designing a multistage poly-phase filter is proposed.

However, in order to deign the multistage poly-phase filter, a very wide range of frequencies has to be set so as to cover a practically desired frequency range, and this causes an increase in area.

SUMMARY OF THE INVENTION

The present invention provides a poly-phase filter having constant frequency characteristics regardless of changes in a manufacturing process or temperature.

The present invention also provides a receiver having constant electronic characteristics regardless of changes in a manufacturing process or temperature.

According to an aspect of the present invention, there is provided poly-phase filter including a calibration control block and a poly-phase filter block. The calibration control block 210 generates a first filter characteristic control signal R_cal and a second filter characteristic control signal C_cal for determining electrical characteristics of the filter in response to first and second control signals CON1 and CON2. The poly-phase filter block 240 performs filtering on a plurality of input signals having different phases from each other in response to the first and second filter characteristic control signals R_cal and C_cal.

According to another aspect of the present invention, there is provided a receiver using the poly-phase filter having the calibration control block and the poly-phase filter block.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, exemplary embodiments of the present invention will be described in detail with reference to the attached drawings.

Figure 1:
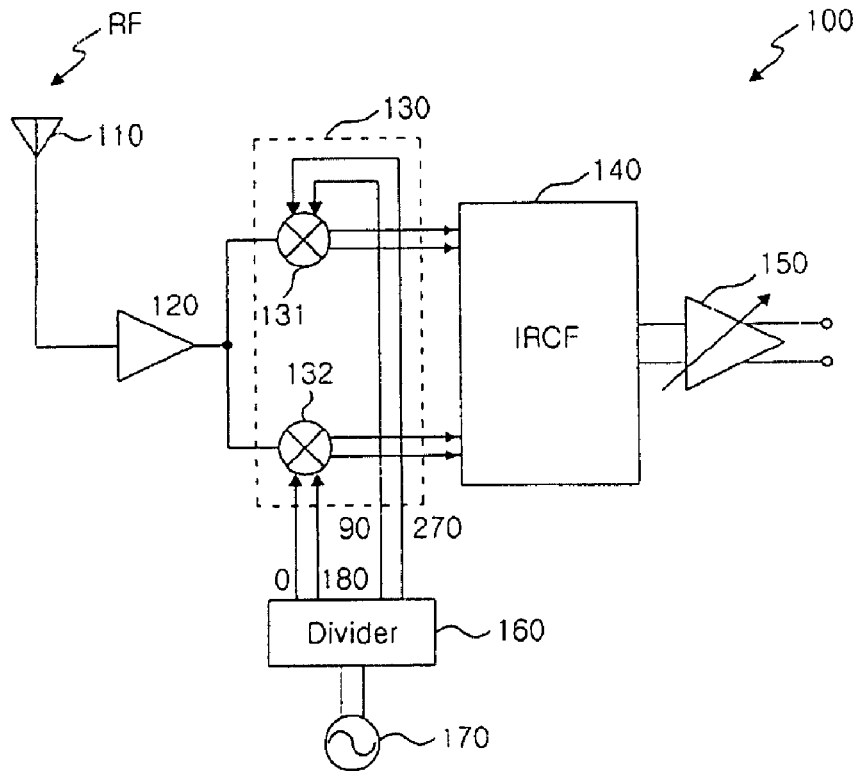
FIG. 1 is a circuit diagram of a conventional low intermediate frequency (IF) receiver.
Figure 2:
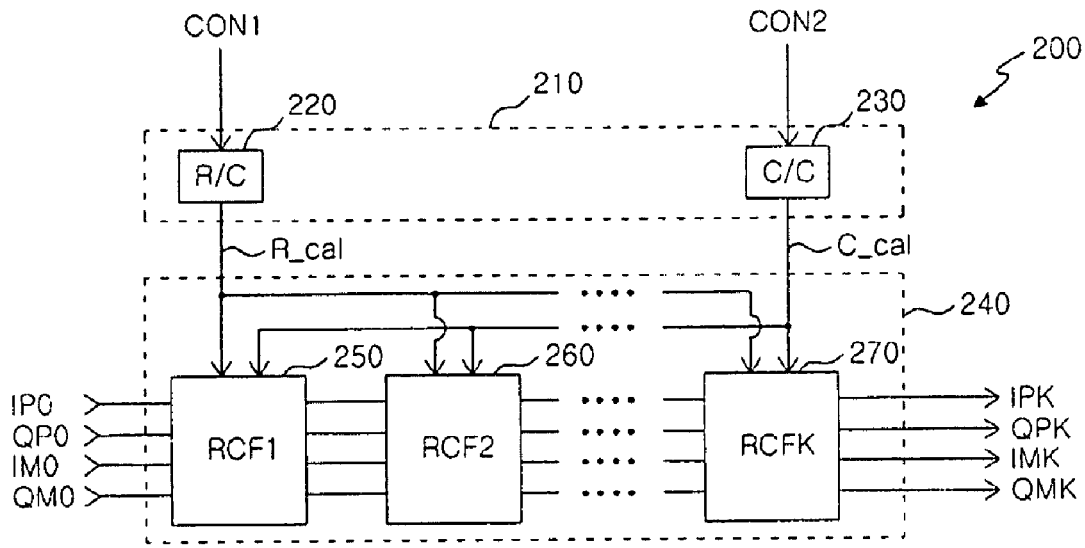
FIG. 2 is a schematic diagram of a poly-phase filter according to the present invention.

FIG. 2 is a schematic diagram of a poly-phase filter according to the present invention.

Referring to FIG. 2, the poly-phase filter according to the present invention includes a calibration control block 210 and a poly-phase filter block 240.

The calibration control block 210 includes a first control signal generator 220 and a second control signal generator 230. The first control signal generator 220 generates a first filter characteristic control signal R_cal for controlling a value of at least one first type device included in the poly-phase filter block 240 in response to a first control CON1. The second control signal generator 230 generates a second filter characteristic control signal C_cal for controlling a value of at least one second type device included in the poly-phase filter block 240 in response to a second control signal CON2.

The poly-phase filter block 240 includes one or more poly-phase filter circuits 250 to 270.

The first poly-phase filter circuit 250 performs filtering on four input signals IP0, QP0, IM0, and QM0 having different phases from each other in response to the first and second filter characteristic control signals R_cal and C_cal and transmits the filtered four signals to the second poly-phase filter circuit 260. The aforementioned operations are repeated to allow the third poly-phase filter circuit 270 which is the last poly-phase filter circuit to generate desired signals IPK, QPK, IMK, and QMK.

Figure 3:
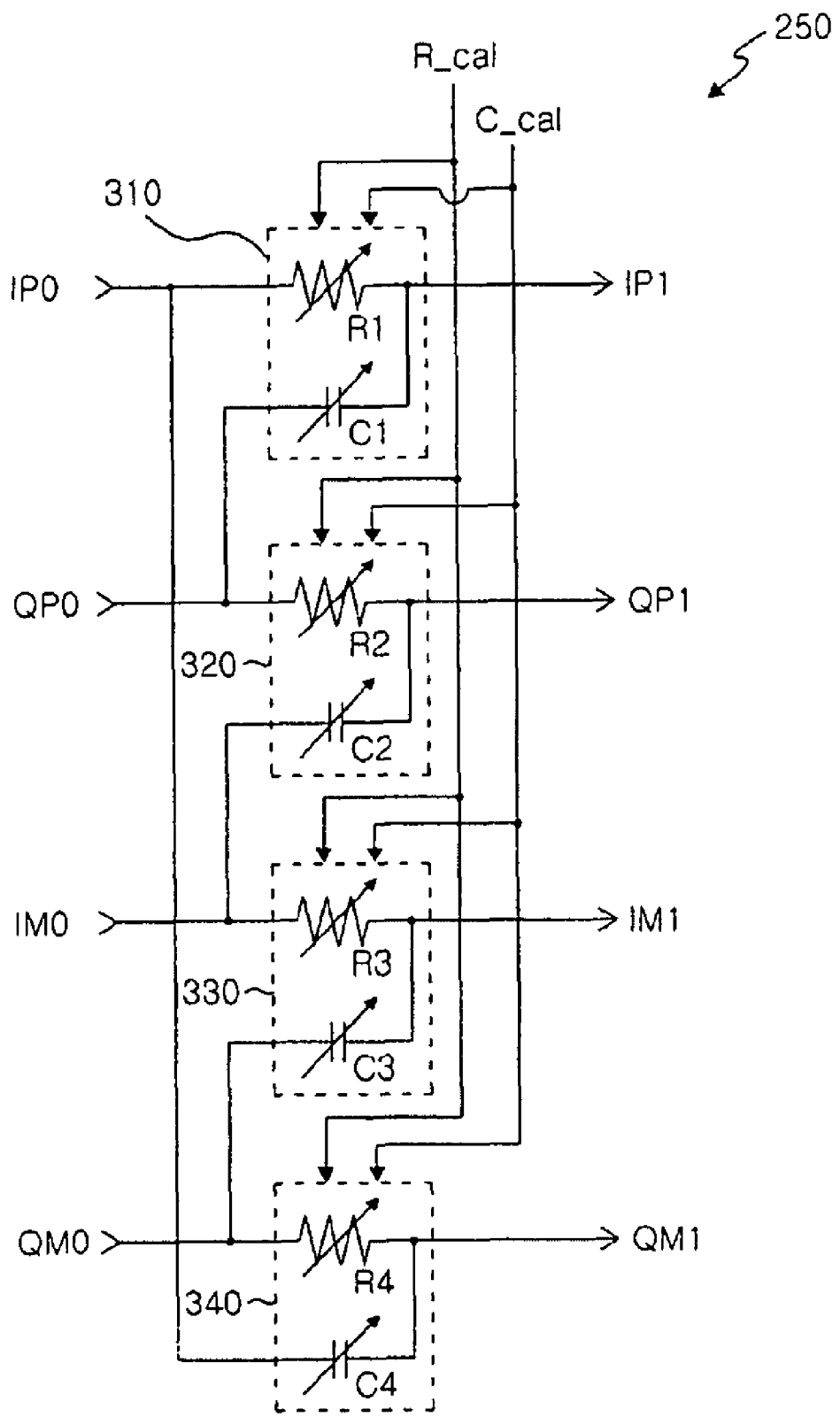
FIG. 3 is a circuit diagram illustrating a detailed construction of a poly-phase filter circuit according to the present invention.

FIG. 3 is a circuit diagram illustrating a detailed construction of the poly-phase filter circuit 250 according to the present invention.

Referring to FIG. 3, the poly-phase filter circuit 250 according to the present invention includes a number of phase filters 310 to 340 corresponding to the first to fourth input signals IP0 to QM0 having phases which are different from each other by 90°.

The first phase filter 310 performs filtering on the first input signal IP0 based on the second input signal QP0 in response to the first and second filter characteristic control signals R_cal and C_cal. The second phase filter 320 performs filtering on the second input signal QP0 based on the third input signal IM0 in response to the first and second filter characteristic control signals R_cal and C_cal. The third phase filter 330 performs filtering on the third input signal IM0 based on the fourth input signal QM0 in response to the first and second filter characteristic control signals R_cal and C_cal. The fourth phase filter 340 performs filtering the fourth input signal QM0 based on the first input signal IP0 in response to the first and second filter characteristic control signals R_cal and C_cal.

Each of the first to fourth phase filters 310 to 340 is a resistor-capacitor (RC) filter including a variable resistor and a variable capacitor. The first filter characteristic control signal R_cal determines a resistance of the variable resistor, and the second filter characteristic control signal C_cal determines a capacitance of the variable capacitor.

The first phase filter 310 includes a first variable resistor R1 and a first variable capacitor C1. A terminal of the first variable resistor R1 is connected to the first input signal IP0, and the other terminal thereof generates a first output signal IP1. A terminal of the first variable capacitor C1 is connected to the other terminal of the first variable resistor R1, and the other terminal thereof is connected to the second input signal QP0.

The second phase filter 320 includes a second variable resistor R2 and a second variable capacitor C2. A terminal of the second variable resistor R2 is connected to the second input signal QP0, and the other terminal thereof generates a second output signal QP1. A terminal of the second variable capacitor C2 is connected to the other terminal of the second variable resistor R2, and the other terminal thereof is connected to the third input signal IM0.

The third phase filter 330 includes a third variable resistor R3 and a third variable capacitor C3. A terminal of the third variable resistor R3 is connected to the third input signal IM0, and the other terminal thereof generates a third output signal IM1. A terminal of the third variable capacitor C3 is connected to the other terminal of the third variable resistor R3, and the other terminal thereof is connected to the fourth input signal QM0.

The fourth phase filter 340 includes a fourth variable resistor R4 and a fourth variable capacitor C4. A terminal of the fourth variable resistor R4 is connected to the fourth input signal QM0, and the other terminal thereof generates a fourth output signal QM1. A terminal of the fourth variable capacitor C4 is connected to the other terminal of the fourth variable resistor R4, and the other terminal thereof is connected to the first input signal IP0.

As described above, each of the first to fourth phase filters 310 to 340 is the RC filter including the variable resistor and the variable capacitor. The resistors and the capacitors in the poly-phase filter circuit 250 can be designed to have the function of rejecting image components in a desired frequency band regardless of process variables by controlling and adjusting the resistances and the capacitances by the calibration control block 210.

As described above, the poly-phase filter according to the present invention has a constant frequency characteristic regardless of changes in a manufacturing process and temperature, so that the poly-phase filter has advantages of having the high-performance image rejection function and significantly reducing chip variations.

In addition, an image frequency of the poly-phase filter is constant regardless of the change in the manufacturing process, so that excess stages are not needed, a die area is reduced, signal attenuation of more than a predetermined level can be prevented, a buffer end is reduced, and correspondingly power consumption can be reduced.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A poly-phase filter comprising:
a calibration control block generating a first filter characteristic control signal and a second filter characteristic control signal for determining electrical characteristics of the filter in response to first and second control signals; and
a poly-phase filter block performing filtering on a plurality of input signals having different phases from each other in response to the first and second filter characteristic control signals,
wherein the poly-phase filter block comprises at least one poly-phase filter circuit which performs filtering on a plurality of input signals having different phases from each other in response to the first and second filter characteristic control signals,
wherein the poly-phase filter circuit comprises a number of phase filters corresponding to a plurality of the input signals,
wherein a plurality of the input signals are first to fourth input signals having phases which are different from each other by 90°, and
wherein a number of the phase filters comprise:
a first phase filter performing filtering on the first input signal based on the second input signal;
a second phase filter performing filtering on the second input signal based on the third input signal;
a third phase filter performing filtering on the third input signal based on the fourth input signal; and a fourth phase filter performing filtering on the fourth input signal based on the first input signal, and wherein filter characteristics of the four phase filters are controlled by the first and second filter characteristic control signals.

2. The poly-phase filter of claim 1, wherein each of the first to fourth phase filters includes the first type device and the second type device, wherein the first type device is a variable resistor having a resistance that is determined by the first filter characteristic control signal, and wherein the second type device is a variable capacitor having a capacitance that is determined by the second filter characteristic control signal.

3. The poly-phase filter of claim 2, wherein the first phase filter comprises a first variable resistor having a terminal connected to the first input signal and the other terminal generating a first output signal and a first variable capacitor having a terminal connected to the other terminal of the first variable resistor and the other terminal connected to the second input signal;

wherein the second phase filter comprises a second variable resistor having a terminal connected to the second input signal and the other terminal generating a second output signal and a second variable capacitor having a terminal connected to the other terminal of the second variable resistor and the other terminal connected to the third input signal;

wherein the third phase filter comprises a third variable resistor having a terminal connected to the third input signal and the other terminal generating a third output signal and a third variable capacitor having a terminal connected to the other terminal of the third variable resistor and the other terminal connected to the fourth input signal; and wherein the fourth phase filter comprises a fourth variable resistor having a terminal connected to the fourth input signal and the other terminal generating a fourth output signal and a fourth variable capacitor having a terminal connected to the other terminal of the fourth variable resistor and the other terminal connected to the first input signal.

* * * * *